United States Patent
Jochem

(10) Patent No.: US 12,276,839 B2
(45) Date of Patent: Apr. 15, 2025

(54) MANUFACTURING A SEMICONDUCTOR STRUCTURE

(71) Applicant: SMART Photonics Holding B.V., Eindhoven (NL)

(72) Inventor: Maria Johanna Helena Jochem, Eindhoven (NL)

(73) Assignee: SMART PHOTONICS HOLDING B.V., Eindhoven (NL)

( * ) Notice: Subject to any disclaimer, the term of this patent is extended or adjusted under 35 U.S.C. 154(b) by 266 days.

(21) Appl. No.: 17/721,053

(22) Filed: Apr. 14, 2022

(65) Prior Publication Data
US 2022/0244460 A1    Aug. 4, 2022

Related U.S. Application Data

(63) Continuation of application No. PCT/EP2020/079295, filed on Oct. 16, 2020.

(30) Foreign Application Priority Data

Oct. 23, 2019   (GB) ..................................... 1915374

(51) Int. Cl.
*G02B 6/12*    (2006.01)
*G02B 6/136*   (2006.01)

(52) U.S. Cl.
CPC ......... *G02B 6/136* (2013.01); *G02B 6/12004* (2013.01); *G02B 2006/12078* (2013.01)

(58) Field of Classification Search
CPC ...... G02B 6/136; G02B 6/12004; G02B 6/12; G02B 2006/12078; H01L 21/20
See application file for complete search history.

(56) References Cited

U.S. PATENT DOCUMENTS

| | | | |
|---|---|---|---|
| 4,665,610 A | 5/1987 | Barth | |
| 9,450,072 B2 * | 9/2016 | Chou | ................ H01L 21/02107 |
| 2004/0038513 A1 | 2/2004 | Kohl et al. | |
| 2004/0146803 A1 | 7/2004 | Kohl et al. | |
| 2007/0042521 A1 | 2/2007 | Yama | |

(Continued)

FOREIGN PATENT DOCUMENTS

| | | |
|---|---|---|
| GB | 2427748 A | 1/2007 |
| JP | 2003179170 A | 6/2003 |

(Continued)

OTHER PUBLICATIONS

United Kingdom Search Report dated Mar. 8, 2021 for GB Application No. GB1915374.1.

(Continued)

*Primary Examiner* — Jennifer Doan
(74) *Attorney, Agent, or Firm* — EIP US LLP

(57) ABSTRACT

A method of manufacturing a semiconductor structure comprising: depositing a first layer in contact with a first surface area of a substrate; depositing a second layer in contact with a second surface area of the substrate, the second surface area substantially co-planar with and outwards of the first surface area; depositing a third layer in contact with the first layer and the second layer; removing a portion of the third layer to expose a portion of the first layer; and removing at least a portion of the first layer to create a cavity between the substrate, the second layer and the third layer.

20 Claims, 4 Drawing Sheets

(56) References Cited

U.S. PATENT DOCUMENTS

| | | |
|---|---|---|
| 2007/0249081 A1 | 10/2007 | Luo et al. |
| 2013/0135971 A1 | 5/2013 | Nakanishi |
| 2015/0372454 A1 | 12/2015 | Guilloy et al. |
| 2016/0079397 A1* | 3/2016 | Cheng ................. H01L 29/0649 438/157 |
| 2018/0358779 A1 | 12/2018 | Hwang et al. |

FOREIGN PATENT DOCUMENTS

| | | |
|---|---|---|
| JP | 2013179170 A | 9/2013 |
| WO | 2004056698 A2 | 7/2004 |
| WO | 2016060619 A1 | 4/2016 |
| WO | 2021038300 A1 | 3/2021 |

OTHER PUBLICATIONS

International Search Report and Written Opinion dated Jan. 11, 2021 for PCT Application No. PCT/EP2020/079295.
Combined Search and Examination report dated Apr. 30, 2024 for United Kingdom Application No. GB2403342.5.
European Examination report dated Nov. 21, 2023 for European Application No. 20803446.2.

* cited by examiner

MANUFACTURING A SEMICONDUCTOR STRUCTURE

CROSS-REFERENCE TO RELATED APPLICATIONS

This application is a continuation of International Application No. PCT/EP2020/079295, filed Oct. 16, 2020, which claims priority to United Kingdom Application No. GB1915374.1, filed Oct. 23, 2019, under 35 U.S.C. § 119(a). Each of the above referenced patent applications is incorporated by reference in its entirety.

BACKGROUND

Field of the Invention

In certain Photonic Integrated Circuits (PICs), there is a benefit in having a membrane of semiconductor material bounded by dielectric material (such as air or a polymer material). Typically, such structures are fabricated by depositing a layer of a first semiconductor material over the whole surface area of a substrate, depositing a layer of a second semiconductor material over the whole surface area of the layer of the first material, applying a masking material to one or more portions of the second material layer and etching that layer to expose one or portions of the first material layer. Then an etching process is applied in which an etchant material is allowed to pass through to the exposed portions of the first semiconductor material layer to etch it. Such a process is problematic in that it requires careful control of the time that the etchant material is applied to the first material layer in order to provide the required dimensions. Furthermore, in some cases it may not be possible to etch a material asymmetrically.

It is desirable to provide a more reliable method of manufacturing a semiconductor structure.

DETAILED DESCRIPTION

Examples described herein relate to methods of manufacturing semiconductor structures. In particular, but not exclusively, they relate to manufacturing membranes of semiconductor material for use in a Photonic Integrated Circuit (PIC).

As will be elaborated below, for example with reference to block 110, a more precisely shaped and dimensioned cavity may be created by etching. This allows more design freedom and intricacy for semiconductor structures for a PIC.

Figure 1:
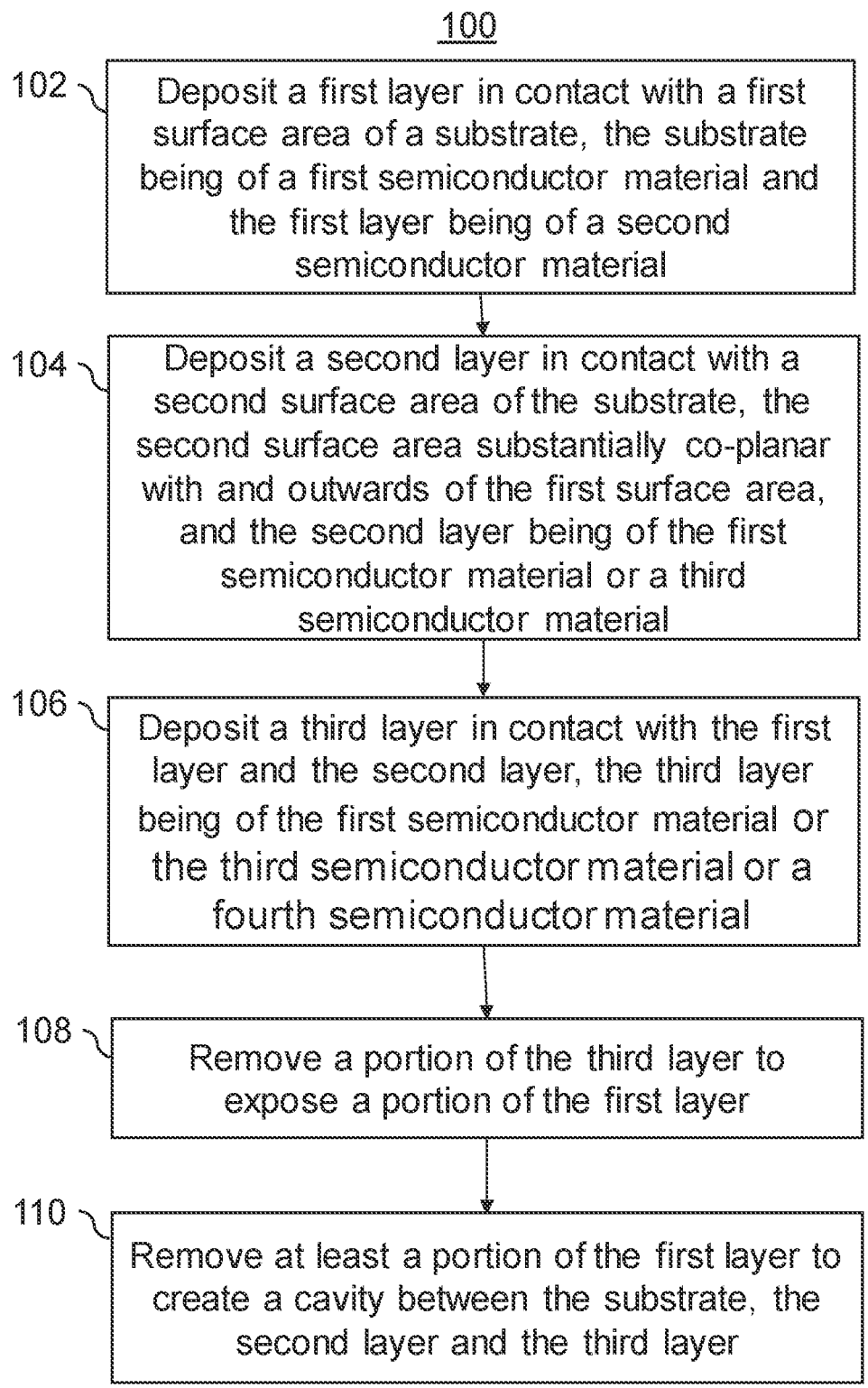
FIG. 1 is a flow diagram illustrating a method of manufacturing a semiconductor structure, according to examples.

FIG. 1 is a flow diagram illustrating, in a general manner, a method 100 of manufacturing a semiconductor structure, according to examples.

At block 102, a first layer is deposited in contact with a first surface area of a substrate. The substrate is of a first semiconductor material and the first layer is of a second semiconductor material.

At block 104, a second layer is deposited in contact with a second surface area of the substrate. The second surface area is substantially co-planar with, and outwards of, the first surface area. The second layer is of the first semiconductor material or a third semiconductor material, different from the first semiconductor material. The first surface area may otherwise be referred to as an inner surface area and the second surface area may otherwise be referred to as an outer surface area.

By saying substantially co-planar, the second surface layer is for example deposited in contact with an area of the substrate that is continuous with the area of the substrate on which the first layer is deposited. The first and second surface areas may therefore lie in the same plane as each other, within acceptable manufacturing tolerances which may occur through depositing the first and second layers separately.

In some examples, the first layer is deposited substantially across the whole surface area of the substrate (e.g. except for areas of the substrate that are clamped by a wafer clamp of a reactor in which the semiconductor is being manufactured). In such examples, the second surface area is then be exposed prior to depositing the second layer, by removing an outer portion of the first layer, outwards of the first surface area. For example, the outer portion is removed by an etching process, which may be a dry etching process or a wet etching process, or a combination of wet and dry etching processes. In other examples, the first layer is deposited onto the first surface area without also being deposited on the second surface area (for example using a mask).

The first layer is deposited with a first thickness and the second layer may be deposited with a second thickness substantially equal to the first thickness. In this way, an upper surface of the second layer is expected to be (within acceptable manufacturing tolerances) continuous with an upper surface of the first layer. This provides a continuous (e.g. flat or planar) or near continuous surface on which to deposit further layers, such as the third layer described below with reference to block 106. It is envisaged that each depositing process is subject to manufacturing tolerances and the resulting upper surfaces may not be completely continuous (e.g. not together forming an exactly flat surface or lying in the same plane as each other).

At block 106, a third layer is deposited in contact with the first layer and the second layer. The third layer is of the first semiconductor material or may instead be of the third semiconductor material or a fourth semiconductor material different to the first semiconductor material. For example, each of the third and fourth materials is of gallium arsenide (GaAs), gallium nitride (GaN) or gallium antimonide (GaSb) and, for example, the substrate 202 is of gallium arsenide (GaAs), gallium nitride (GaN) or gallium antimonide (GaSb).

As described above, it is envisaged that the upper surfaces of the first and second layer are substantially continuous within manufacturing tolerances. By depositing the third layer on a substantially continuous surface, an upper surface of the third layer is also substantially continuous (within the same tolerances), so as for example to provide a suitably flat or planar surface.

At block 108, a portion of the third layer is removed to expose a portion of the first layer.

In some examples, removing a portion of the third layer comprises selectively etching a portion of the third layer using a mask. Such selective etching may comprise a dry etching process that is selective by virtue of a physical (e.g. selective by virtue of a voltage induced physical impact on the third layer) aspect of the etching process, or may be a wet etching process that is selective by virtue of a chemical preference to combine with (and therefore selectively etch) one material over another.

At block 110, at least a portion of the first layer is removed to create a cavity between the substrate, the second layer and the third layer.

In examples, removing the at least a portion of the first layer comprises applying an etchant that preferentially etches the second semiconductor material with respect to the first semiconductor material. Because the first layer is surrounded (by the substrate, the second layer and the third layer) by material that is etched (if at all) by the etchant at a much lower etch rate than the rate at which the first layer is etched by the etchant, the surrounding layers provide a so-called "etch stop" which enables the etch process to be conducted without requiring close control of the time for which the etch process is conducted. Instead, the material properties of the materials surrounding the first layer provide a physical boundary preventing any, or any significant, over-etching of surrounding materials. That is the materials that are not intended to be etched are not etched by the etchant to a degree that impedes performance of the resulting structure. As a result, a side of a cavity created by removing at least a portion of the first layer may correspond to, for example be bounded by, the side of the second layer. This side of the cavity may have substantially planar surface, rather than a curved shape due to partial etching into the second layer. Hence, a more precisely shaped and dimensioned cavity can be created. Such extra control over known techniques allows more design freedom and intricacy for semiconductor structures.

In some examples, a cavity is a gap or space, for example filled with air, located between the third layer and the substrate in a first direction (a direction perpendicular to the plane of the substrate) and between outer portions of the second layer in a second direction (a direction perpendicular to the first direction and parallel to the plane of the substrate). Thus, sides of the cavity correspond with, for example be bounded by, a surface (e.g. with the first surface area) of the substrate, at least one inner surface of the second layer, and a surface of the third layer. In examples, the cavity is subsequently be at least partly filled with a material other than air, for example a dielectric material.

For context, the method described above with reference to FIG. 1 is described with reference to a PIC. A PIC is an optical circuit in which two or more photonic devices (e.g. devices that perform functions using light) are integrated. A PIC may include components that perform functions including, for example: emitting light; detecting light; amplifying light; guiding light; reflecting light; diffracting light; mixing light of different wavelengths; separating light of different wavelengths; polarisation conversion; optical filtering; power splitting; amplitude modulation; and phase modulation. A PIC can be considered an optical analogue of an electronic circuit.

In some examples, the third layer is used as a membrane. Such a membrane may be "active" in that it comprises a gain material that can provide amplification of light passing through the membrane (e.g. membrane lasers) or passive in that it is optically transparent or absorbs light passing through the membrane.

A commonly commercially utilised material platform for PICs is indium phosphide (InP), which allows for integration of optically active and passive functions on the same chip; however, other material platforms such as silicon (Si), Gallium Arsenide (GaAs) or lithium niobite ($LiNBO_3$), may be utilised as a platform for PICs.

Examples of PICs comprise hundreds of components integrated in a single chip.

Examples described above generally are now explained in detail using FIGS. 2a to 2g, which are a series of diagrams showing, in cross-sectional views, the formation of a semiconductor structure 200 during a manufacture process such as the method 100 described above with reference to FIG. 1.

Figure 2A:
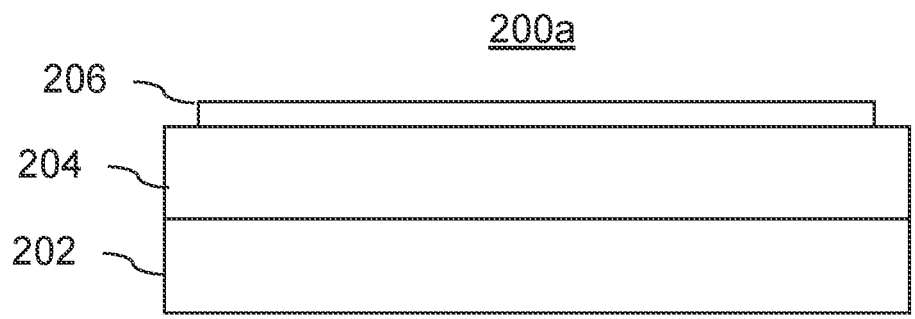
FIGS. 2a to 2g are a series of cross-sectional views of a semiconductor structure during various stages of manufacture, according to examples.

FIG. 2a shows a first semiconductor structure 200a comprising a substrate 202, which is typically a semiconductor wafer onto which further epitaxial layer are grown or otherwise deposited. In the examples described herein the substrate 202 is a substantially pure indium phosphide (InP) substrate. That is the substrate 202 comprises mainly InP. The substrate 202 may be purely InP (within acceptable purity tolerances) or may comprise other materials such as dopants or impurities with the material comprising at least 99% InP. For example, the substrate 202 is doped with a dopant material so that the substrate may be considered n-doped or the substrate 202 is doped with a dopant material so that the substrate 202 may be considered p-doped, or the substrate 202 is doped with a dopant material so that the substrate 202 may be considered semi-insulating.

In other examples, the substrate 202 is of another semiconductor material. For example, the substrate 202 is of gallium arsenide (GaAs), gallium nitride (GaN) or gallium antimonide (GaSb).

On a first surface of the substrate 202, referred to hereinafter as an upper surface of the substrate 202, a first layer 204 of semiconductor material is deposited. The first layer 204 is of a material that is different to the material of the substrate 202. For example, where the substrate 202 comprises InP, the first layer 204 is a semiconductor material that does not comprise InP. For example, the first layer 204 is a tertiary or quaternary alloy comprising InP and other binary semiconductor materials such as gallium arsenide (GaAs), indium arsenide (InAs), aluminium arsenide (AlAs) and gallium phosphide (GaP).

In the state shown in FIG. 2a, a first mask 206 is applied to an upper surface of the first layer 204. The mask 206 is an etch mask arranged to resist etching. The first mask 206 is patterned to expose portions of the first layer 204. When an etchant is applied to the first layer 204, the etchant preferentially removes the first layer 204 with respect to the first mask 206; that is the etchant is selective in terms of the materially with which it chemically or physically interacts with to remove material so that the rate at which the first layer 204 is removed by the etchant exceeds the rate at which the first mask 206 is removed by the etchant. The ratio of the etch rate of the first layer 204 to the etch rate of the first mask 206 for a given etchant is referred to as selectivity.

Figure 2B:
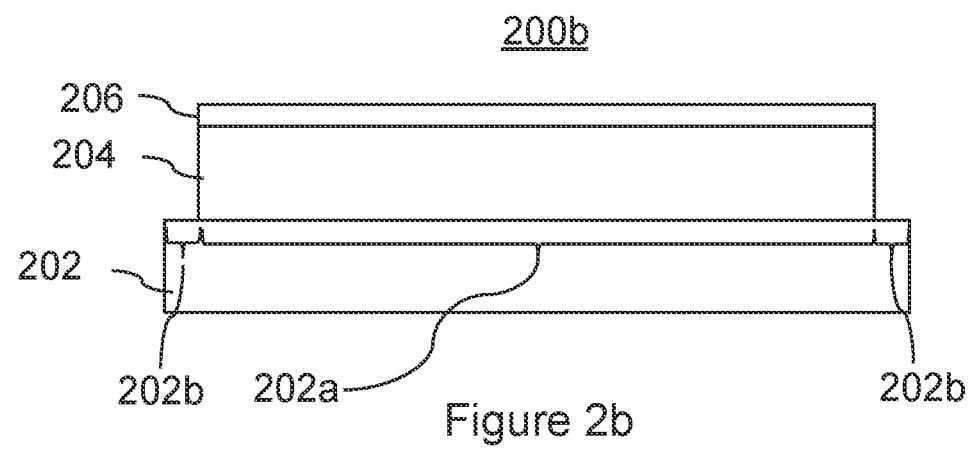

FIG. 2b shows a second semiconductor structure 200b after application of an etch process to remove portions of the first layer 204 over a first surface area 202a of the substrate 202.

The etch process used to remove the first layer 204 may be a wet etch (e.g. by immersion of the first semiconductor structure 200a in a liquid chemical etchant) or a dry etch (e.g. by exposure of the upper surface of the first semiconductor structure 200a to a plasma or a sputtering process), or a combination of wet and dry etching.

Figure 2C:
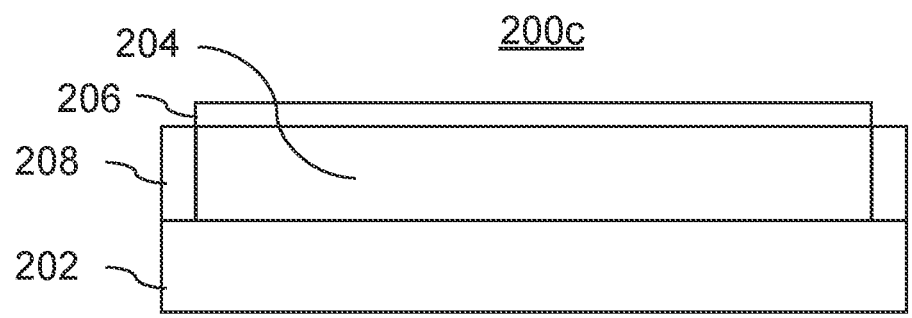

Following removal of a portion of the first layer 204 over a second surface area 202b of the substrate 202, a further deposition process (sometimes referred to as a regrowth process) is performed to deposit a second layer 208 of semiconductor material in contact with a second surface area 202b of the substrate 202, as shown in FIG. 2c. The second layer 208 is deposited on a second surface area 202b coplanar with, and outwards of, the first surface area 202a of the substrate 202. That is, the thickness of the first layer 204 and the second layer 208 are substantially equal so that their upper surfaces are approximately level. Similar to the explanation given above with reference to FIG. 1, saying that the thickness of the first layer 204 and the second layer 208 are substantially equal so that their upper surfaces are approximately level means for example that within the manufacturing tolerances specified above, the thicknesses of the respective thicknesses of the first and second layers are equal and consequently, within those same manufacturing tolerances, the upper surfaces are level or in line with each other.

The second layer 208 forms, as shown in FIG. 2c, a third semiconductor structure 200c including so-called "butt-joint" between the first layer 204 as the second layer 208 such that the second layer 208 abuts the first layer 204.

In this example, the second layer 208 comprises the same material as the substrate 202. In some examples, the second layer 208 is substantially pure indium phosphide (InP) substrate. That is the substrate 202 comprises mainly InP. The substrate 202 may be purely InP or may comprise other materials such as dopants or impurities. For example, the substrate 202 is doped with a dopant material so that the substrate may be considered n-doped or the substrate 202 is doped with a dopant material so that the substrate 202 may be considered p-doped.

Figure 2D:
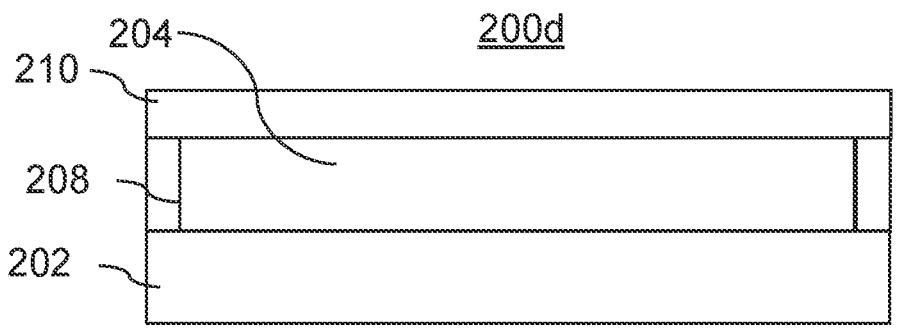

Following formation of the second layer 208, the first mask 206 is removed. Then a third layer 210 is deposited, in contact with the first layer 204 and the second layer 208 is deposited, as shown in FIG. 2d, which shows a fourth semiconductor structure 200d. The third layer 210 is of the first semiconductor material. For example, the third layer may comprise InP and may comprise the same material as the substrate 202 and the second layer 208.

Figure 2E:
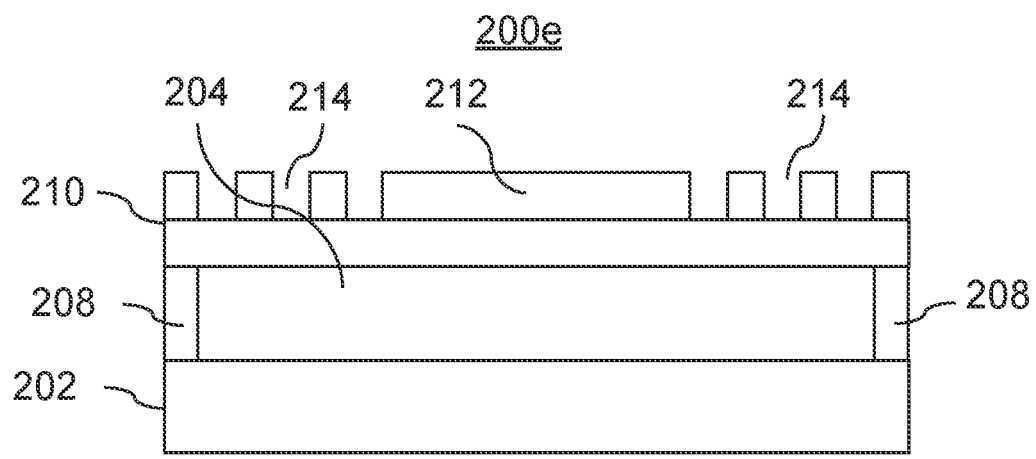

Following formation of the third layer 210, a second mask 212 is defined on the third layer 210, to form a fifth semiconductor structure 200e as shown in FIG. 2e. The second mask 212 comprises one or more openings 214. The openings 214 provide a path for etchant materials to pass.

Figure 2F:
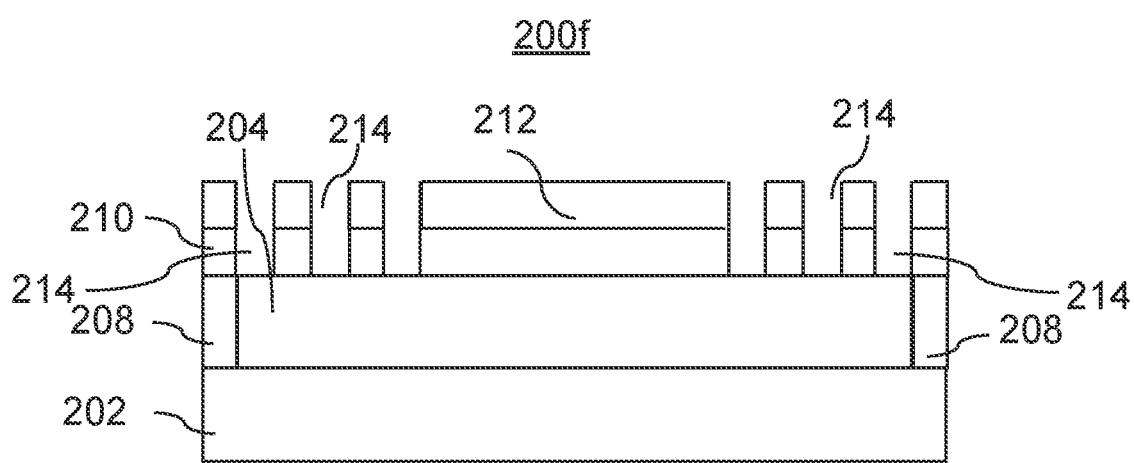

In a first etching process, which may be a wet etch process or a dry etch process, an etchant is applied to portions of the third layer 210 exposed by the openings 214 in the second mask 212. The resulting sixth semiconductor structure 200f is as shown in FIG. 2f.

In a second etching process, an etchant is applied to the first layer 204. The etchant accesses the first layer 204 via the openings 214 and corresponding openings 216 formed in the third layer 210 by the first etching process.

Figure 2G:
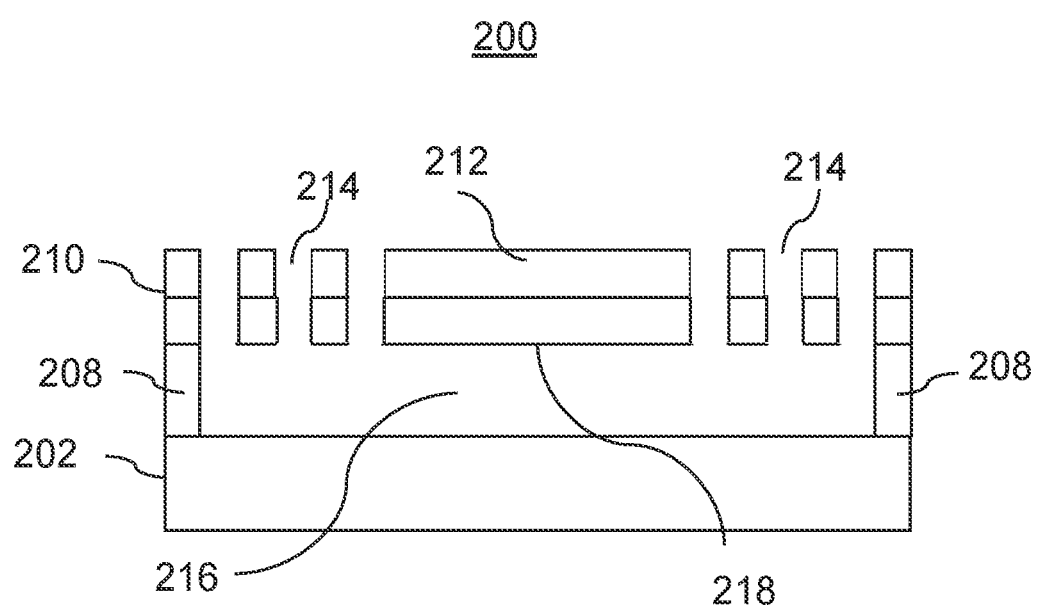

The second etchant process applies etchant that preferentially etches the first layer 204 with respect to the substrate 202 and the second layer 208 to create, as shown in FIG. 2g a cavity 216. The cavity 216 may be an air gap located between the third layer 218 and the substrate 202 in a first direction (a direction perpendicular to the plane of the substrate 202) and between the material of the second layer 208 in a second direction (a direction perpendicular to the first direction and parallel to the plane of the substrate 202). In other examples, the cavity 216 is subsequently filled with a material other than air. For example, the cavity 216 is at least partly filled with one or more of: benzocyclobutene (BCB), polymethylmethacrylate (PMMA), or SU-8. The cavity 216, whether filled by air or at least partly by a dielectric material, in some examples may be considered to define a side of a membrane (corresponding to the third layer) that is separated from the substrate 202.

The semiconductor structure 200 manufactured according to the manufacturing method 100 described above with reference to FIG. 1, and shown in FIG. 2g, may be a component of a PIC. For example, the semiconductor structure 200 is a membrane laser or a passive membrane waveguide.

As the skilled person will appreciate, various techniques may be used to deposit a layer of semiconductor material in accordance with examples described herein. Such a technique may be known as a regrowth technique, for example a metalorganic vapour-phase epitaxy (MOVPE) or a molecular beam epitaxy (MBE) process may be used.

The above examples are to be understood as illustrative examples of the invention. It is to be understood that any feature described in relation to any one example may be used alone, or in combination with other features described, and may also be used in combination with one or more features of any other of the examples, or any combination of any other of the examples. Furthermore, equivalents and modifications not described above may also be employed without departing from the scope of the accompanying claims.

What is claimed is:

1. A method of manufacturing a semiconductor structure, comprising:
   (i) depositing a first layer in contact with a first surface area of a substrate, the substrate being of a first semiconductor material and the first layer being of a second semiconductor material;
   (ii) depositing a second layer in contact with a second surface area of the substrate, the second surface area substantially co-planar with and outwards of the first surface area, and the second layer being of the first semiconductor material or a third semiconductor material;
   (iii) depositing a third layer in contact with the first layer and the second layer, the third layer being of the first semiconductor material or the third semiconductor material or a fourth semiconductor material;
   (iv) removing a portion of the third layer to expose a portion of the first layer; and
   (v) removing at least a portion of the first layer to create a cavity between the substrate, the second layer and the third layer.

2. The method of claim 1, wherein the first semiconductor material comprises indium phosphide.

3. The method of claim 1, wherein the second semiconductor material is a tertiary alloy or a quaternary alloy, the second semiconductor material not comprising indium phosphide.

4. The method of claim 1, wherein the first layer has a first thickness and the second layer has a second thickness substantially equal to the first thickness.

5. The method of claim 1, comprising removing an outer portion of the first layer to expose the second surface area.

6. The method of claim 5, wherein removing comprises an etching process.

7. The method of claim 6, wherein the etching process is a dry etching process.

8. The method of claim 1, comprising depositing the second layer to abut a side surface of the first layer.

9. The method of claim 1, wherein removing a portion of the third layer comprises selectively etching a portion of the third layer using a mask.

10. The method of claim 9, wherein the selective etching comprises a dry etching process, a wet etching process, or a combination of wet and dry etching processes.

11. The method of claim 1, wherein removing the at least a portion of the first layer comprises applying an etchant that preferentially etches the second material with respect to the first material.

12. The method of claim 1, wherein at least one of the third or fourth semiconductor material comprises one or more of: indium phosphide, gallium arsenide, gallium nitride or gallium antimonide.

13. The method of claim 1, comprising after v), at least partly filling the cavity with a dielectric material.

14. The method of claim 13, wherein the dielectric material comprises one or more of: benzocyclobutene (BCB), polymethylmethacrylate (PMMA), or SU-8.

15. The method of claim 1, wherein an upper surface of the second layer is co-planar with an upper surface of the first layer.

16. The method of claim 1, wherein the third layer is a membrane for a laser.

17. The method of claim 16, wherein the membrane comprises a gain material for a laser.

18. The method of claim 17, wherein the semiconductor structure is usable as a membrane laser.

19. The method of claim 13, wherein the dielectric material is at least one of: a material other than air, a solid, or a polymer.

20. The method of claim 1, comprising, after v), at least partly filling the cavity with at least one of: a material other than air, a solid material, a polymer material.

* * * * *